(12) United States Patent
Iga et al.

(10) Patent No.: US 12,538,763 B2
(45) Date of Patent: *Jan. 27, 2026

(54) BONDED WAFER PROCESSING METHOD

(71) Applicant: DISCO CORPORATION, Tokyo (JP)

(72) Inventors: Hayato Iga, Tokyo (JP); Kazuya Hirata, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 208 days.

This patent is subject to a terminal disclaimer.

(21) Appl. No.: 18/499,704

(22) Filed: Nov. 1, 2023

(65) Prior Publication Data

US 2024/0153776 A1 May 9, 2024

(30) Foreign Application Priority Data

Nov. 7, 2022 (JP) ................................ 2022-178075

(51) Int. Cl.
| | | |
|---|---|---|
| *H01L 21/02* | (2006.01) | |
| *B23K 26/00* | (2014.01) | |
| *B23K 26/067* | (2006.01) | |
| *B23K 26/08* | (2014.01) | |
| *B23K 26/53* | (2014.01) | |
| *H01L 21/18* | (2006.01) | |

(Continued)

(52) U.S. Cl.
CPC .... *H01L 21/02021* (2013.01); *B23K 26/0006* (2013.01); *B23K 26/0676* (2013.01); *B23K 26/0823* (2013.01); *B23K 26/53* (2015.10); *H01L 21/02008* (2013.01); *H01L 21/02013* (2013.01); *H01L 21/02016* (2013.01); *H01L 21/185* (2013.01); *H01L 21/187* (2013.01); *H01L 21/304* (2013.01); *H01L 21/67092* (2013.01); *B23K 2103/56* (2018.08)

(58) Field of Classification Search
CPC ...................... H01L 21/67092; B23K 26/0676
See application file for complete search history.

(56) References Cited

U.S. PATENT DOCUMENTS

| | | | |
|---|---|---|---|
| 6,420,245 B1 * | 7/2002 | Manor ................... | B28D 5/022 438/460 |
| 7,682,225 B2 * | 3/2010 | Hongo .................... | B24B 37/02 451/446 |

(Continued)

FOREIGN PATENT DOCUMENTS

| | | | | |
|---|---|---|---|---|
| CN | 103862180 A | * | 6/2014 | ............ H10F 39/12 |
| JP | 2005032804 A | * | 2/2005 | |

(Continued)

*Primary Examiner* — Benjamin A Schiffman
(74) *Attorney, Agent, or Firm* — GREER BURNS & CRAIN, LTD.

(57) ABSTRACT

A method of processing a bonded wafer formed by bonding a first wafer and a second wafer to each other via a bonding layer includes a coordinate generating step of generating coordinates of an undersurface position of the first wafer, the undersurface position being to be irradiated with laser beams, such that an end position of a crack extending from modified layers formed within the first wafer is located at an outer circumference of the bonding layer, and a modified layer forming step of forming a plurality of modified layers in a ring shape by irradiating the coordinates generated in the coordinate generating step with the laser beams of a wavelength transmissible through the first wafer.

3 Claims, 6 Drawing Sheets

(51) Int. Cl.
*H01L 21/304* (2006.01)
*H01L 21/67* (2006.01)
*B23K 103/00* (2006.01)

(56) References Cited

U.S. PATENT DOCUMENTS

| | | | | |
|---|---|---|---|---|
| 8,125,654 | B2* | 2/2012 | Benvegnu | H01L 22/12 |
| | | | | 356/630 |
| 8,821,644 | B2* | 9/2014 | Sakuragi | H01L 21/02087 |
| | | | | 134/6 |
| 9,138,913 | B2* | 9/2015 | Arai | B41M 5/26 |
| 9,255,894 | B2* | 2/2016 | VanHoomissen | |
| | | | | G01N 21/9505 |
| 9,815,138 | B2* | 11/2017 | Hirata | B23K 26/0604 |
| 9,929,018 | B2* | 3/2018 | Bieck | H01L 21/6704 |
| 10,249,518 | B2* | 4/2019 | Adachi | B24B 49/003 |
| 10,576,585 | B1* | 3/2020 | Donofrio | B23K 26/0006 |
| 10,870,176 | B2* | 12/2020 | Hirata | B23K 26/0823 |
| 11,222,822 | B2* | 1/2022 | Yamamoto | H01L 21/78 |
| 11,819,950 | B2* | 11/2023 | Komatsu | B23K 26/0823 |
| 11,881,407 | B2* | 1/2024 | Nagaya | H01L 21/2683 |
| 11,958,132 | B2* | 4/2024 | Hirata | B28D 5/0011 |
| 12,011,781 | B2* | 6/2024 | Ungaro | B23K 26/53 |
| 12,151,401 | B2* | 11/2024 | Komatsu | B28D 5/0064 |
| 12,191,138 | B2* | 1/2025 | Tsuchiya | H01L 21/6836 |
| 12,251,776 | B2* | 3/2025 | Flamm | C03B 33/0222 |
| 12,275,091 | B2* | 4/2025 | Korematsu | B23K 26/08 |
| 12,288,682 | B2* | 4/2025 | Kim | B23K 26/083 |
| 2004/0065647 | A1* | 4/2004 | Kubo | H01L 21/67092 |
| | | | | 257/E23.179 |
| 2004/0169869 | A1* | 9/2004 | Shin | G01N 21/9501 |
| | | | | 356/635 |
| 2005/0199592 | A1* | 9/2005 | Iri | B23K 26/40 |
| | | | | 219/121.6 |
| 2008/0128396 | A1* | 6/2008 | Shigematsu | B23K 26/702 |
| | | | | 219/121.67 |
| 2008/0200100 | A1* | 8/2008 | Takahashi | H01L 21/67219 |
| | | | | 438/692 |
| 2023/0036386 | A1* | 2/2023 | Taylor | B23K 26/0652 |
| 2023/0048318 | A1* | 2/2023 | Hirata | B23K 26/38 |
| 2023/0050807 | A1* | 2/2023 | Iga | H01L 21/268 |
| 2023/0054570 | A1* | 2/2023 | Sakamoto | B23K 26/0648 |
| 2023/0066601 | A1* | 3/2023 | Iga | B23K 26/53 |
| 2024/0087901 | A1* | 3/2024 | Sekiya | B23K 26/0853 |
| 2024/0112902 | A1* | 4/2024 | Iga | H01L 21/78 |
| 2024/0120215 | A1* | 4/2024 | Iga | B24B 7/228 |
| 2024/0128087 | A1* | 4/2024 | Iga | H01L 21/6835 |
| 2024/0145248 | A1* | 5/2024 | Iga | H01L 22/12 |
| 2024/0153776 | A1* | 5/2024 | Iga | H01L 21/02021 |
| 2024/0194501 | A1* | 6/2024 | Iizuka | H01L 21/68728 |
| 2024/0297052 | A1* | 9/2024 | Tanaka | H01L 21/78 |
| 2024/0304448 | A1* | 9/2024 | Tanaka | H01L 21/304 |
| 2024/0304457 | A1* | 9/2024 | Tanaka | H01L 21/304 |
| 2024/0339326 | A1* | 10/2024 | Chen | H01L 21/67051 |
| 2024/0399494 | A1* | 12/2024 | Hirata | B23K 26/38 |
| 2025/0014949 | A1* | 1/2025 | Mizutani | H01L 22/12 |

FOREIGN PATENT DOCUMENTS

| | | | | |
|---|---|---|---|---|
| JP | 2008500907 | A * | 1/2008 | ....... H01L 21/67023 |
| JP | 2008298696 | A * | 12/2008 | ......... G01N 21/8806 |
| JP | 2010225976 | A | 10/2010 | |
| JP | 2013237115 | A * | 11/2013 | |
| JP | 2016096295 | A | 5/2016 | |
| JP | 2020136662 | A * | 8/2020 | ....... H01L 21/67242 |
| JP | 2022043891 | A * | 3/2022 | |
| JP | 2024011097 | A * | 1/2024 | |

\* cited by examiner

BONDED WAFER PROCESSING METHOD

BACKGROUND OF THE INVENTION

Field of the Invention

The present invention relates to a bonded wafer processing method.

Description of the Related Art

A wafer having a plurality of devices such as integrated circuits (ICs) or large-scale integrations (LSIs), formed on a top surface thereof so as to be demarcated by a plurality of planned dividing lines intersecting one another is divided into individual device chips by a dicing apparatus. The divided device chips are used in electric equipment such as mobile phones, or personal computers.

In addition, in order to improve a degree of integration of the devices, two wafers after the formation of patterns may be bonded to each other, and one wafer may be thinned by grinding the undersurface of the one wafer.

However, when the one wafer is thinned by the grinding, a chamfered portion formed at the outer circumference of the wafer assumes a sharp shape such as a knife edge. There is thus a problem of causing an injury to a worker or damaging device chips when a crack generated from the knife edge is developed to the inside of the wafer.

Accordingly, technologies have been proposed which suppress the occurrence of the knife edge by directly positioning a cutting blade or grinding stones at the periphery of the wafer to be thinned by grinding, and removing the chamfered portion (see Japanese Patent Laid-Open No. 2010-225976 and Japanese Patent Laid-Open No. 2016-96295, for example).

SUMMARY OF THE INVENTION

The technologies disclosed in Japanese Patent Laid-Open No. 2010-225976 and Japanese Patent Laid-Open No. 2016-96295 described above present not only a problem in that the removal of the chamfered portion by the cutting blade or the grinding stones takes a considerable time, thus resulting in poor productivity, but also a problem of damaging the other wafer.

It is accordingly an object of the present invention to provide a bonded wafer processing method that can solve the problem in that the removal of a chamfered portion of one wafer of a bonded wafer in which two wafers are bonded to each other takes time, resulting in poor productivity, and the problem of damaging the other wafer.

In accordance with an aspect of the present invention, there is provided a method for processing a bonded wafer formed by bonding a top surface of a first wafer and a top surface or an undersurface of a second wafer having a same diameter as that of the first wafer to each other by a bonding layer, the first wafer having, on the top surface, a device region in which a plurality of devices are formed and a peripheral surplus region surrounding the device region, the peripheral surplus region having a chamfered portion at an outer edge thereof. The method includes a condensing point setting step of branching a laser beam of a wavelength transmissible through the first wafer into a plurality of laser beams, and setting condensing points of the respective branched laser beams at different positions, a coordinate generating step of generating coordinates of an undersurface position of the first wafer, the undersurface position being to be irradiated with the laser beams, such that an end position of a crack extending from the condensing points to the bonding layer side is located at an outer circumference of the bonding layer on a basis of a fact that a line connecting the undersurface position of the first wafer, the undersurface position being irradiated with the laser beams, internal positions of the condensing points in the first wafer, and the end position of the crack is at a different angle according to a crystal orientation of the first wafer, a modified layer forming step of forming a plurality of modified layers in a ring shape within the first wafer by positioning the condensing points of the branched laser beams in an inner part of the first wafer, the inner part being radially inward of the chamfered portion, and irradiating the coordinates of the undersurface position of the first wafer, the coordinates being generated in the coordinate generating step, with the laser beams of the wavelength transmissible through the first wafer, while holding the second wafer side by a first chuck table and rotating the first chuck table, and a grinding step of holding the second wafer side by a second chuck table and thinning the first wafer by grinding an undersurface of the first wafer after performing the modified layer forming step. In the modified layer forming step, the condensing points of the laser beams being formed in plural in a form of a descending staircase gradually approaching the bonding layer from an inside to an outside of the first wafer, the crack extending from a modified layer formed by a lowermost condensing point reaching the outer circumference of the bonding layer, and a plane connecting the plurality of modified layers formed by the plurality of condensing points forming a side surface of a circular truncated cone.

Preferably, in the grinding step, the modified layers are removed by grinding the undersurface of the first wafer, and the chamfered portion is removed from the first wafer by the crack. Preferably, the first wafer is a single crystal silicon wafer, and in the coordinate generating step, a direction in which a notch indicating the crystal orientation is formed as viewed from a center of the first wafer is defined as 0 degrees, coordinates at the 0 degrees, 90 degrees, 180 degrees, and 270 degrees are arranged on a first concentric circle, coordinates at 45 degrees, 135 degrees, 225 degrees, and 315 degrees are positioned on a second concentric circle smaller than the first concentric circle, and the coordinates of the undersurface position of the first wafer, the undersurface position being to be irradiated with the laser beams, are generated by connecting coordinate points at the 0 degrees, the 45 degrees, the 90 degrees, the 135 degrees, the 180 degrees, the 225 degrees, the 270 degrees, and the 315 degrees by a smooth curve between the first concentric circle and the second concentric circle.

According to the bonded wafer processing method in accordance with the present invention, in addition to the shortening of a processing time and a resulting improvement in productivity as compared with conventional chamfered portion removal, the problem of damaging the other wafer is also solved. Further, because the coordinate generating step described above is performed, the crack extending within the first wafer is stably developed to the coordinate position of the outer circumference of the bonding layer in the stacked bonded wafer, and the chamfered portion can be removed reliably without an effect of the bonding layer being incurred, even when the angle of the crack differs according to a rotational angle.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A bonded wafer processing method according to an embodiment of the present invention and an embodiment of a processing apparatus suitable for performing the bonded wafer processing method will hereinafter be described in detail with reference to the accompanying drawings.

Figure 1:
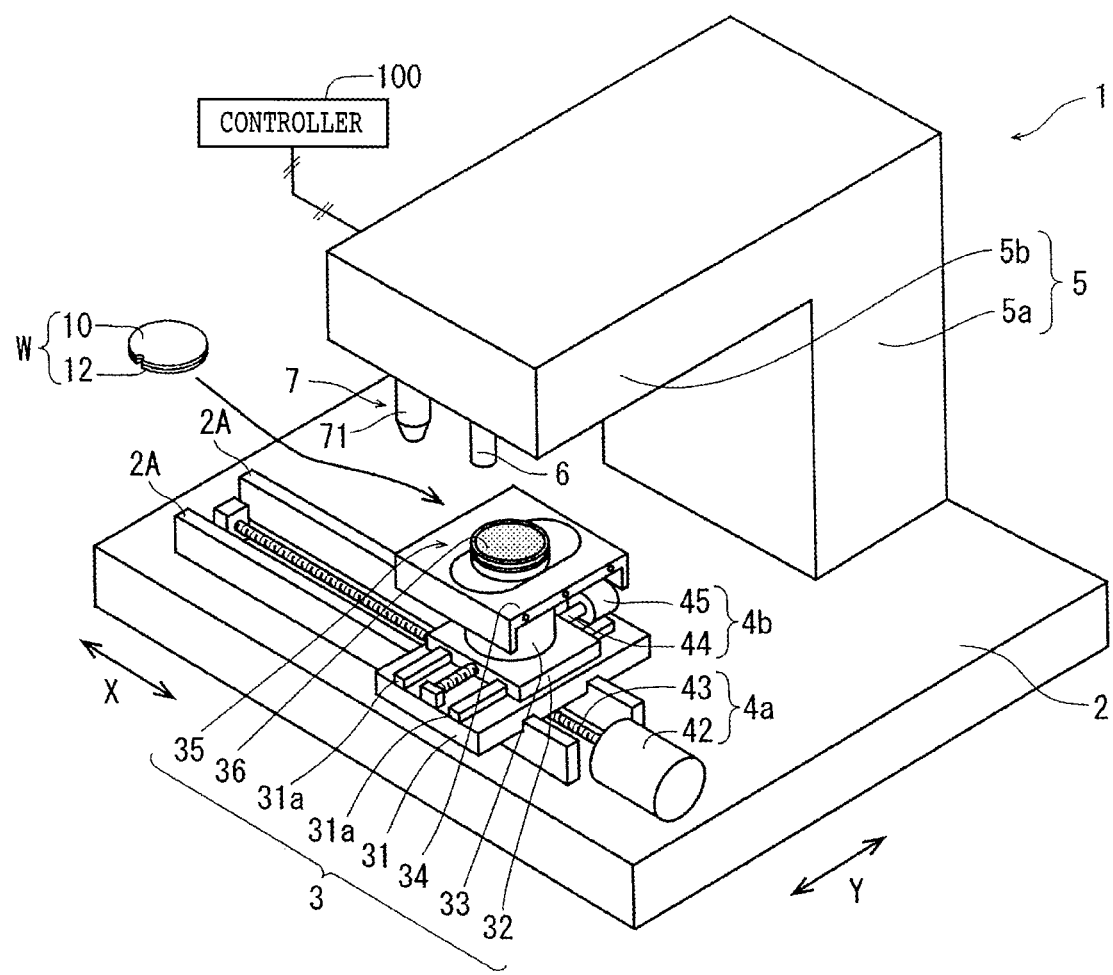
FIG. 1 is a general perspective view of a processing apparatus.

FIG. 1 illustrates a general perspective view of a processing apparatus 1. The processing apparatus 1 is an apparatus for performing laser processing on a bonded wafer W in which a first wafer 10 and a second wafer 12 are bonded to each other as depicted in the figure. The processing apparatus 1 includes a holding unit 3 that holds the bonded wafer W, a laser beam irradiating unit 7 that applies a laser beam of a wavelength transmissible through the first wafer 10 of the bonded wafer W held by the holding unit 3, an X-axis feed mechanism 4a for processing-feeding the holding unit 3 and the laser beam irradiating unit 7 relative to each other in an X-axis direction, a Y-axis feed mechanism 4b for processing-feeding the holding unit 3 and the laser beam irradiating unit 7 relative to each other in a Y-axis direction orthogonal to the X-axis direction, and a controller 100 that controls each operating unit.

The processing apparatus 1 is disposed on a base 2. In addition to the configuration described above, the processing apparatus 1 includes an imaging unit 6 that images the bonded wafer W held by the holding unit 3 to perform alignment, and a frame body 5 including a vertical wall portion 5a erected on a side of the X-axis feed mechanism 4a and the Y-axis feed mechanism 4b and a horizontal wall portion 5b that extends in a horizontal direction from an upper end portion of the vertical wall portion 5a.

As depicted in FIG. 1, the holding unit 3 includes a rectangular X-axis direction movable plate 31 mounted on the base 2 so as to be movable in the X-axis direction, a rectangular Y-axis direction movable plate 32 mounted on the X-axis direction movable plate 31 so as to be movable in the Y-axis direction, a cylindrical column 33 fixed to the upper surface of the Y-axis direction movable plate 32, a rectangular cover plate 34 fixed to an upper end of the column 33, and a chuck table 35 disposed so as to extend upward through an elongated hole formed in the cover plate 34. The chuck table 35 is configured to be rotatable by a rotational driving mechanism not depicted in the figure which rotational driving mechanism is housed in the column 33. The holding surface of the chuck table 35 is formed by a suction chuck 36 of a porous material having air permeability. The holding surface of the chuck table 35 is connected to suction means not depicted in the figure through a flow passage passing through the column 33.

The X-axis feed mechanism 4a converts rotary motion of a motor 42 into rectilinear motion via a ball screw 43, and transmits the rectilinear motion to the X-axis direction movable plate 31. The X-axis feed mechanism 4a thereby moves the X-axis direction movable plate 31 in the X-axis direction along a pair of guide rails 2A and 2A arranged along the X-axis direction on the base 2. The Y-axis feed mechanism 4b converts rotary motion of a motor 45 into rectilinear motion via a ball screw 44, and transmits the rectilinear motion to the Y-axis direction movable plate 32. The Y-axis feed mechanism 4b thereby moves the Y-axis direction movable plate 32 in the Y-axis direction along a pair of guide rails 31a and 31a arranged along the Y-axis direction on the X-axis direction movable plate 31. Because such a configuration is provided, the chuck table 35 can be moved to a desired position of an X-coordinate and a Y-coordinate.

An optical system constituting the laser beam irradiating unit 7 described above as well as the imaging unit 6 is housed inside the horizontal wall portion 5b of the frame body 5. The lower surface side of a distal end portion of the horizontal wall portion 5b is provided with a condenser 71 that constitutes a part of the laser beam irradiating unit 7 and which condenses the laser beam and irradiates the bonded wafer W with the laser beam. The imaging unit 6 is a camera for imaging the bonded wafer W held by the holding unit 3, and detecting the position and orientation of the bonded wafer W, a laser processing position to be irradiated with the laser beam, and the like. The imaging unit 6 is disposed at a position adjacent to the condenser 71 described above in the X-axis direction indicated by an arrow X in the figure.

Figure 2:
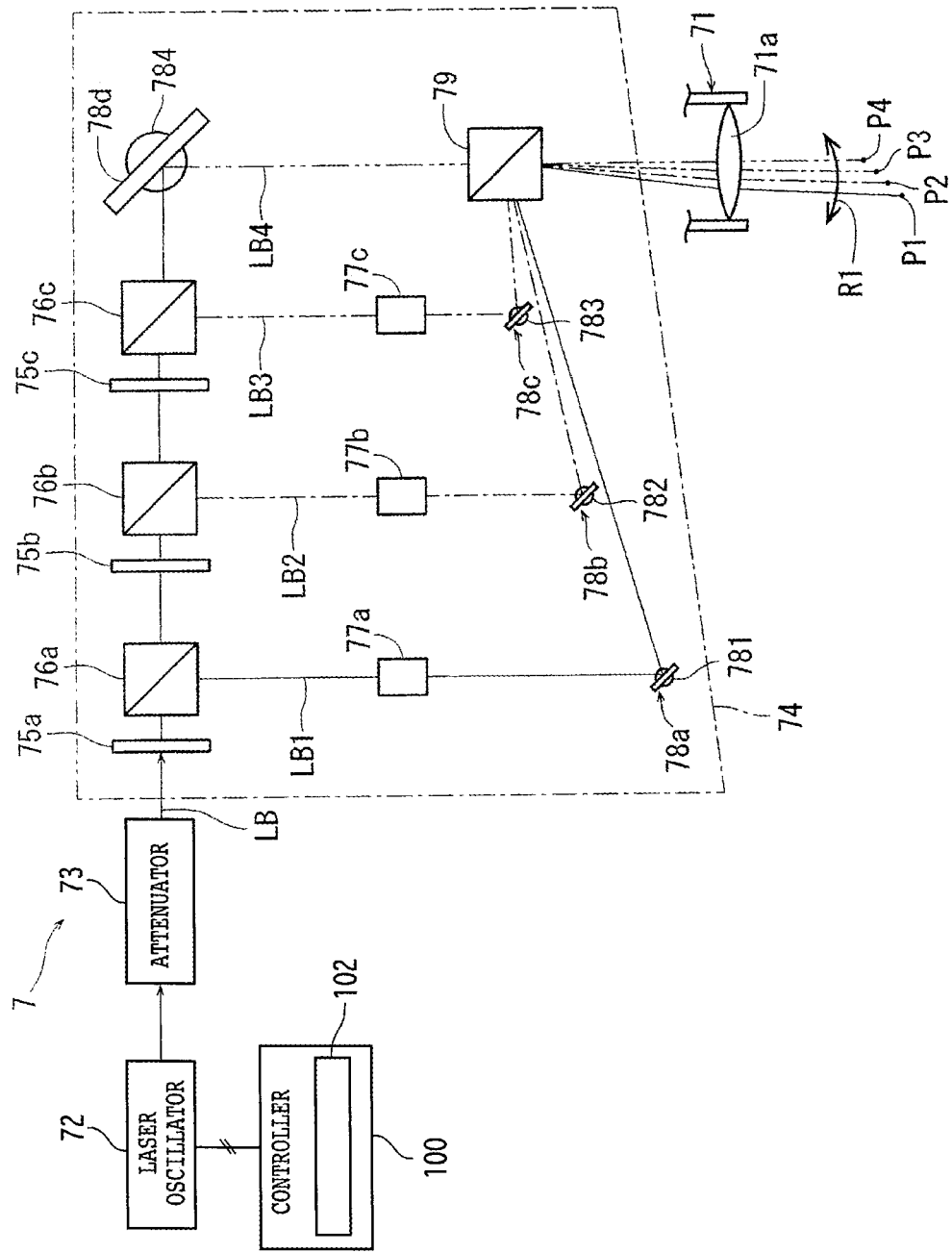
FIG. 2 is a block diagram depicting an optical system of a laser beam irradiating unit mounted in the processing apparatus depicted in FIG. 1.

FIG. 2 illustrates a block diagram depicting an outline of an optical system of the laser beam irradiating unit 7 described above. The laser beam irradiating unit 7 includes a laser oscillator 72 that emits a laser beam LB, an attenuator 73 that adjusts the power of the laser beam LB emitted by the laser oscillator 72, and a condensing point forming unit 74 that branches the laser beam LB passing through the attenuator 73 and forms a plurality of condensing points in a form of a descending staircase in the bonded wafer W held on the chuck table 35.

As depicted in FIG. 2, for example, the condensing point forming unit 74 according to the present embodiment includes a first half-wave plate 75a, a first beam splitter 76a, a second half-wave plate 75b, a second beam splitter 76b, a third half-wave plate 75c, a third beam splitter 76c, a first beam expander 77a, a second beam expander 77b, a third beam expander 77c, a first reflecting mirror 78a, a second reflecting mirror 78b, a third reflecting mirror 78c, a fourth reflecting mirror 78d, and a fourth beam splitter 79.

The laser beam LB that is emitted from the laser oscillator 72 described above, passing through the attenuator 73, and introduced into the condensing point forming unit 74 is guided to the first beam splitter 76a via the first half-wave plate 75a. A first branched laser beam LB1 (s-polarized light) having ¼ of an amount of light of the laser beam LB described above is branched from the first beam splitter 76a and guided to the first beam expander 77a by adjusting the rotational angle of the first half-wave plate 75a as appropriate. In addition, a remaining laser beam (p-polarized light) not branched by the first beam splitter 76a is guided to the second beam splitter 76b via the second half-wave plate 75b. A second branched laser beam LB2 (s-polarized light) having ¼ of the amount of light of the laser beam LB described above is branched from the second beam splitter 76b and guided to the second beam expander 77b by adjusting the rotational angle of the second half-wave plate 75b as appropriate. Further, a remaining laser beam (p-polarized light) not branched by the second beam splitter 76b is guided to the third beam splitter 76c via the third half-wave plate 75c. A third branched laser beam LB3 (s-polarized light) having ¼ of the amount of light of the laser beam LB described above is branched from the third beam splitter 76c and guided to the third beam expander 77c by adjusting the rotational angle of the third half-wave plate 75c as appropriate. A remaining laser beam (p-polarized light) not branched by the third beam splitter 76c becomes a fourth branched laser beam LB4 (p-polarized light) having ¼ of the amount of light of the laser beam LB described above, and is guided to the fourth reflecting mirror 78d. As described above, the first to fourth branched laser beams LB1 to LB4 are each branched with ¼ of the amount of light of the laser beam LB described above.

The first branched laser beam LB1 is s-polarized light. Thus, after the beam diameter of the first branched laser beam LB1 is adjusted by the first beam expander 77a, the first branched laser beam LB1 is reflected by the first reflecting mirror 78a, is guided to and reflected by the fourth beam splitter 79, and is then guided to a condensing lens 71a of the condenser 71. In addition, the second branched laser beam LB2 is also s-polarized light. Thus, after the beam diameter of the second branched laser beam LB2 is adjusted by the second beam expander 77b, the second branched laser beam LB2 is reflected by the second reflecting mirror 78b, is guided to and reflected by the fourth beam splitter 79, and is then guided to the condensing lens 71a of the condenser 71. Further, the third branched laser beam LB3 is also s-polarized light. Thus, after the beam diameter of the third branched laser beam LB3 is adjusted by the third beam expander 77c, the third branched laser beam LB3 is reflected by the third reflecting mirror 78c, is guided to and reflected by the fourth beam splitter 79, and is then guided to the condensing lens 71a of the condenser 71. Then, the fourth branched laser beam LB4 reflected by the fourth reflecting mirror 78d is p-polarized light. Thus, the fourth branched laser beam LB4 moves straight forward through the fourth beam splitter 79, and is then guided to the condensing lens 71a of the condenser 71. The first to third beam expanders 77a to 77c each adjust the magnitude of each of the beam diameters as appropriate such that a relation LB1>LB2>LB3>LB4 is satisfied. As depicted in FIG. 2, condensing points P1 to P4 formed in correspondence with the first to fourth branched laser beams LB1 to LB4 are formed at different positions in a vertical direction and a horizontal direction and are formed in a form of a descending staircase from the condensing point P4 to the condensing point P1 toward a left side in the figure. Further, the first reflecting mirror 78a, the second reflecting mirror 78b, the third reflecting mirror 78c, and the fourth reflecting mirror 78d described above are provided with actuators 781, 782, 783, and 784. By controlling each of the actuators on the basis of a control signal from the controller 100 described above, it is possible to adjust the reflection angle of each of the reflecting mirrors and thus finely adjust the first to fourth branched laser beams LB1 to LB4 in a direction indicated by an arrow R1.

It is to be noted that, while an example has been illustrated in which the condensing point forming unit 74 described above branches the laser beam LB passing through the attenuator 73 into the first to fourth branched laser beams LB1 to LB4 and forms four condensing points (number of branches is four) for the convenience of description, the present invention is not limited to this. When the half-wave plates, the beam splitters, the beam expanders, the reflecting mirrors, or the like are increased in number according to the number of branches, settings can be made so as to form even more branched laser beams (for example, eight branches), the condensing points can be formed in a form of a descending staircase according to the number of branches, and the condensing point forming unit 74 described above can adjust, as appropriate, positions to be irradiated with the first to fourth branched laser beams LB1 to LB4 on an undersurface 10b of the first wafer 10.

The controller 100 is constituted by a computer. The controller 100 includes a central processing unit (CPU) that performs arithmetic processing according to a control program, a read-only memory (ROM) that stores the control program and the like, a readable and writable random access memory (RAM) for temporarily storing a detected detection value, an arithmetic result, and the like, an input interface, and an output interface (details are not depicted in the figure). The controller 100 is connected with the laser beam irradiating unit 7, the actuators 781, 782, 783, and 784, the X-axis feed mechanism 4a, the Y-axis feed mechanism 4b, the rotational driving mechanism of the chuck table 35 which rotational driving mechanism is not depicted in the figure, and the like and is provided with a coordinate storage unit 102 that stores the XY coordinates (to be described later) of an undersurface position of the bonded wafer W to be processed. A modified layer forming step to be described later is performed on the basis of information regarding the XY coordinates stored in the coordinate storage unit 102.

The processing apparatus 1 according to the present embodiment generally has the configuration as described above. The bonded wafer processing method according to the present embodiment will be described in the following.

Figure 3A:
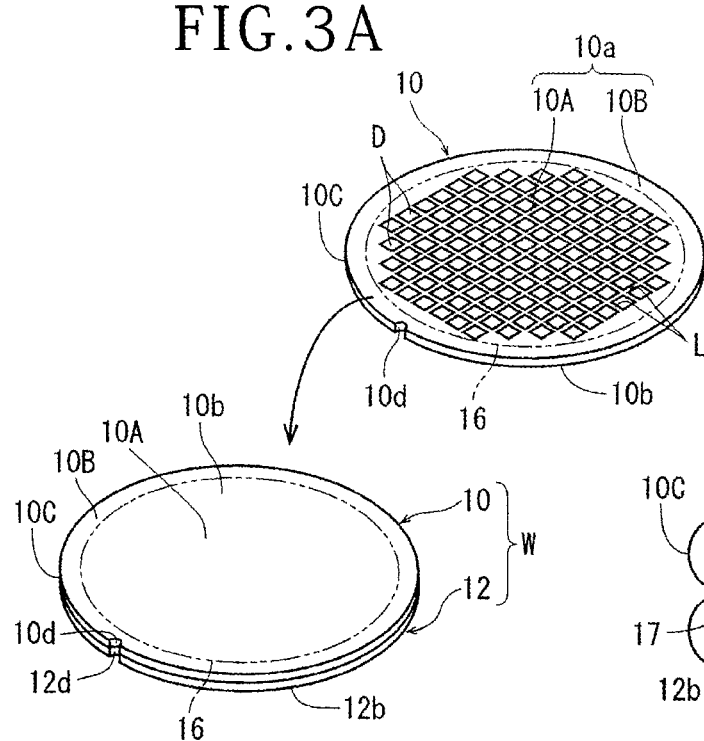
FIG. 3A is a perspective view of a bonded wafer as a workpiece.
Figure 3B:
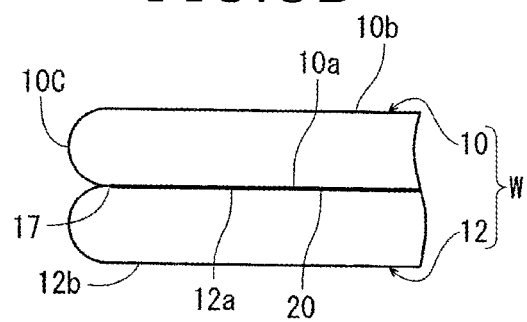
FIG. 3B is a side view in which a part of the bonded wafer depicted in FIG. 3A is enlarged.

A workpiece for the bonded wafer processing method performed in the present embodiment is, for example, the bonded wafer W depicted in FIG. 3A and FIG. 3B. The bonded wafer W, for example, has a diameter of 300 mm. The bonded wafer W is a multilayer wafer in which the first wafer 10 and the second wafer 12 are bonded to each other. The first wafer 10 is, for example, a silicon on insulator (SOI) wafer having an oxide film layer formed in a substrate formed of single crystal silicon. A plurality of devices D are formed on a top surface 10a of the first wafer 10 so as to be demarcated by a plurality of planned dividing lines L intersecting one another, as depicted in the figure. The top surface 10a of the first wafer 10 includes a device region 10A on a central side in which the plurality of devices D described above are formed and a peripheral surplus region 10B surrounding the device region 10A. An annular chamfered portion 10C in a shape of a curved surface is formed at a peripheral end portion of the peripheral surplus region 10B. Further, a notch 10d indicating the crystal orientation of the first wafer 10 is formed in the outer circumference of the peripheral surplus region 10B. Incidentally, while FIG. 3A depicts a division line 16 that divides the device region 10A and the peripheral surplus region 10B from each other, the division line 16 is depicted for the convenience of description, and is not provided to the top surface 10a of an actual first wafer 10.

The second wafer 12 according to the present embodiment has a notch 12d indicating a crystal orientation as with the first wafer 10 and has substantially a same configuration as the first wafer 10. Description of details of the rest will therefore be omitted. As is understood from FIG. 3A and FIG. 3B, the bonded wafer W is formed by bonding the top surface 10a of the first wafer 10 and a top surface 12a of the second wafer 12 to each other via a bonding layer 20 of an appropriate adhesive with the top surface 10a directed downward by inverting the first wafer 10. At this time, as depicted in the figure, both of the wafers are bonded to each other while the crystal orientations are made to coincide with each other by making the notch 10d of the first wafer 10 and the notch 12d of the second wafer 12 coincide with each other. It is to be noted that the bonded wafer W to be processed by the bonded wafer processing method according to the present invention is not limited to the bonded wafer W in which the top surface 10a of the first wafer 10 and the top surface 12a of the second wafer 12 described above are bonded and bonded to each other, but the bonded wafer W may be a bonded wafer in which the top surface 10a of the first wafer 10 and an undersurface 12b of the second wafer 12 are bonded to each other.

In performing the bonded wafer processing method according to the present embodiment, the bonded wafer W described above is transported to the processing apparatus 1 described with reference to FIG. 1, is mounted on the chuck table 35 with the first wafer 10 side upward and with the second wafer 12 side directed downward, and is sucked and held by actuating the suction means described above. Next, the X-axis feed mechanism 4a and the Y-axis feed mechanism 4b are actuated to position the bonded wafer W directly below the imaging unit 6 and image the bonded wafer W. A coordinate generating step is then performed which generates the coordinates of the undersurface position to be irradiated with the laser beam LB such that an end position of a crack extending from the condensing points to the bonding layer side is located at an outer circumference 17 of the bonding layer 20 on the basis of a fact that a line connecting the undersurface position irradiated with the laser beam LB, internal positions of the condensing points, and the end position of the crack is at a different angle according to the crystal orientation of the first wafer. The coordinate generating step will be described more concretely with reference to FIGS. 4A to 6B.

Figure 4A:
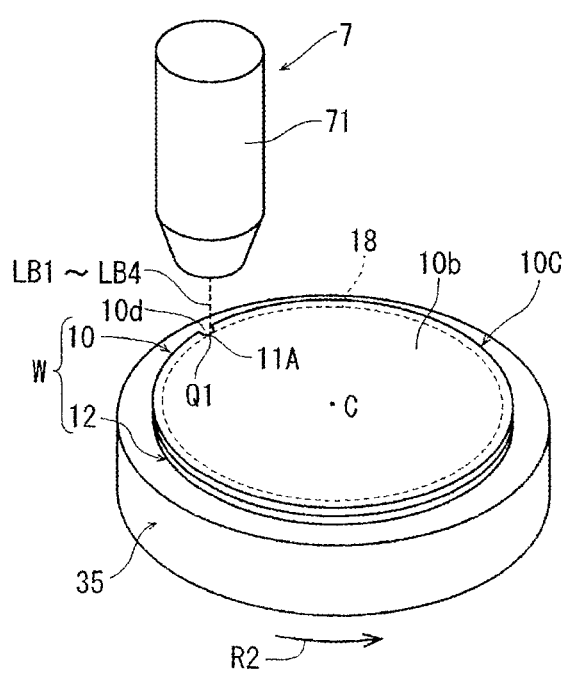
FIG. 4A is a perspective view depicting a manner of performing a modified layer forming step on a point Q1.
Figure 4B:
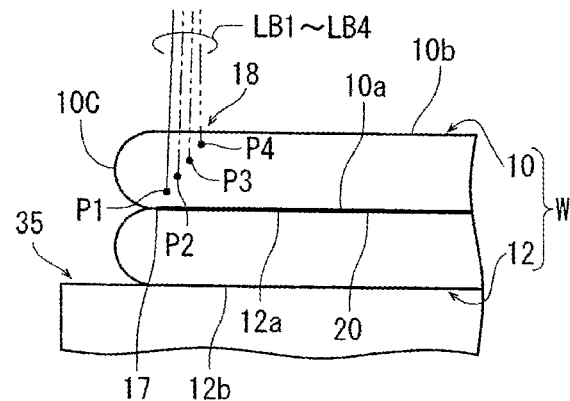
FIG. 4B is a conceptual diagram depicting positions at which a plurality of condensing points are formed in the modified layer forming step depicted in FIG. 4A.
Figure 4C:
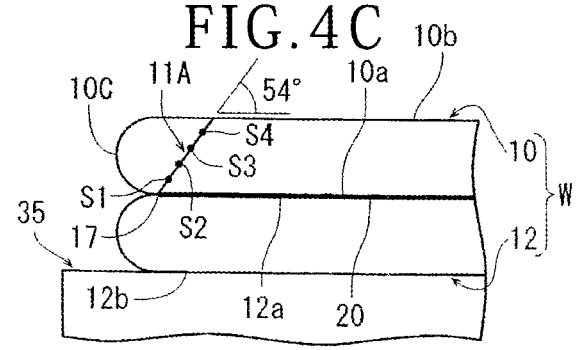
FIG. 4C is a conceptual diagram depicting the angle of modified layers and a crack formed in the modified layer forming step depicted in FIG. 4B.

FIGS. 4A to 4C depict a manner in which the first to fourth branched laser beams LB1 to LB4 are applied on the basis of the coordinate position of an annular processing position 18 which coordinate position is stored in the coordinate storage unit 102 of the controller 100. In the present embodiment, a processing start position is a point Q1 on the processing position 18 in a direction in which the notch 10d indicating the crystal orientation is formed as viewed from a center C of the bonded wafer W. Incidentally, description will be made supposing that the processing position 18 represents a coordinate position of the undersurface 10b which coordinate position is irradiated with the fourth branched laser beam LB4 when the condensing points P1 to P4 formed in correspondence with the first to fourth branched laser beams LB1 to LB4 are formed and applied in a form of a descending staircase from the condensing point P4 to the condensing point P1, as described above. In addition, the coordinates of the processing position 18 are set such that the end position of a crack extending from a modified layer S1 to S4 formed on the basis of the condensing points P1 to P4 reaches the outer circumference 17 of the bonding layer 20 of the bonded wafer W. The coordinates of the processing position 18 are set so as to be inward of the chamfered portion 10C formed by a curved surface, as viewed in a diametrical direction.

Here, the inventor et al. of the present invention have found that, in the bonded wafer having a crystal orientation, the angle of a line connecting the undersurface position irradiated with the first to fourth branched laser beams LB1 to LB4, the internal positions of the condensing points P1 to P4, and the end position of the crack extending from the condensing points P1 to P4 to the bonding layer 20 side of the first wafer 10 becomes a different angle according to the crystal orientation of the first wafer 10.

Figure 5A:
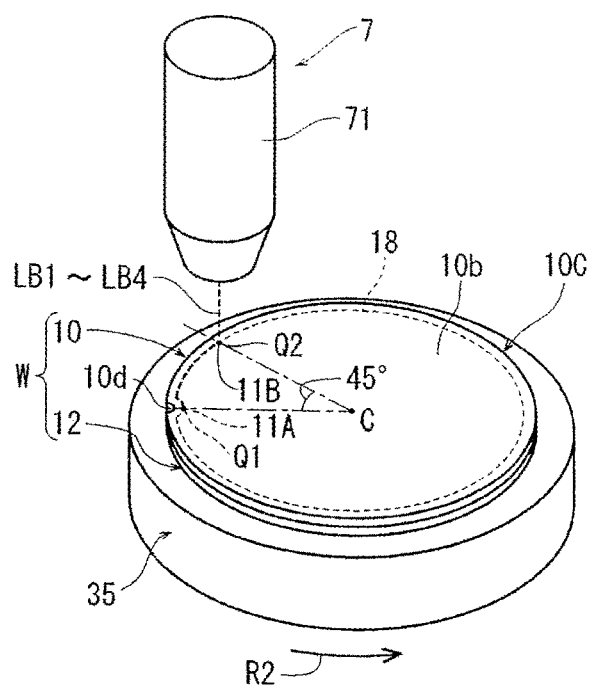
FIG. 5A is a perspective view depicting a manner of performing the modified layer forming step on a point Q2.
Figure 5B:
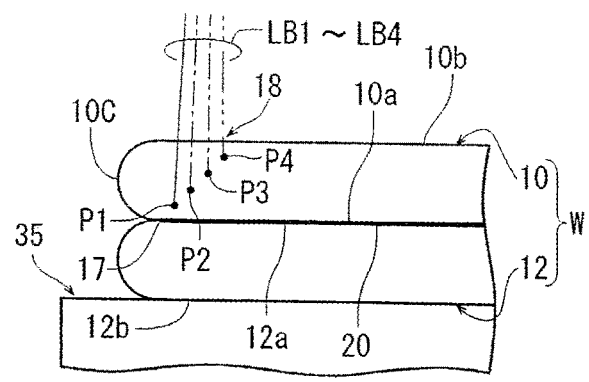
FIG. 5B is a conceptual diagram depicting positions at which a plurality of condensing points are formed in the modified layer forming step depicted in FIG. 5A.
Figure 5C:
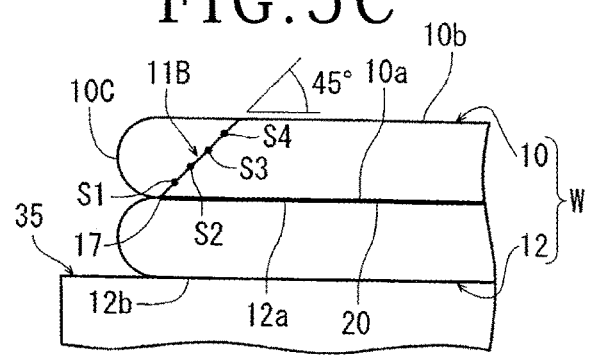
FIG. 5C is a conceptual diagram depicting the angle of modified layers and a crack formed in the modified layer forming step depicted in FIG. 5B.

First, as depicted in FIGS. 4A to 4C, in the first wafer 10 formed of single crystal silicon according to the present embodiment, in a case where the condensing points P1 to P4 formed in correspondence with the first to fourth branched laser beams LB1 to LB4 were formed in a form of a descending staircase from the condensing point P4 to the condensing point P1, as described with reference to FIG. 2 and were applied to the point Q1 of the processing position 18 in the direction in which the notch 10d indicating the crystal orientation was formed in the first wafer 10, the angle of a line connecting the undersurface position irradiated with the laser beams LB1 to LB4, the condensing points P1 to P4, and the end position of a crack 11A extending in a straight line from the modified layers S1 to S4 formed by the condensing points P1 to P4 to the bonding layer 20 side was 54 degrees with respect to the horizontal direction. On the other hand, as depicted in FIGS. 5A to 5C, in a case where the direction in which the notch 10d was formed was defined as 0 degrees, and the first to fourth branched laser beams LB1 to LB4 described above were applied as they were to a point Q2 on the processing position 18 to which point the bonded wafer W was rotated by 45 degrees in a direction indicated by an arrow R2, the angle of a line connecting the undersurface position irradiated with the laser beams LB1 to LB4, the condensing points P1 to P4, and the end position of a crack 11B extending in a straight line from the modified layers S1 to S4 formed by the condensing points P1 to P4 to the bonding layer 20 side was 45 degrees with respect to the horizontal direction, even though the condensing point forming unit 74 was fixed.

Then, as a result of verification performed after rotating the bonded wafer W by 45 degrees at each time in the direction indicated by the arrow R2, as described above, and sequentially irradiating the coordinate positions of a point Q3 at 90 degrees, a point Q4 at 135 degrees, a point Q5 at 180 degrees, a point Q6 at 225 degrees, a point Q7 at 270 degrees, and a point Q8 at 315 degrees with the first to fourth branched laser beams LB1 to LB4 described above, as depicted in FIG. 6A, it was found that the angles of cracks extending in a straight line to the bonding layer 20 side in cases of irradiating the point Q3, the point Q5, and the point Q7 were a similar angle (54 degrees) to that in the case of irradiating the point Q1, and that the angles of cracks extending in a straight line to the bonding layer 20 side in cases of irradiating the point Q4, the point Q6, and the point Q8 with the first to fourth branched laser beams LB1 to LB4 were a similar angle (45 degrees) to that in the case of irradiating the point Q2.

Figure 6A:
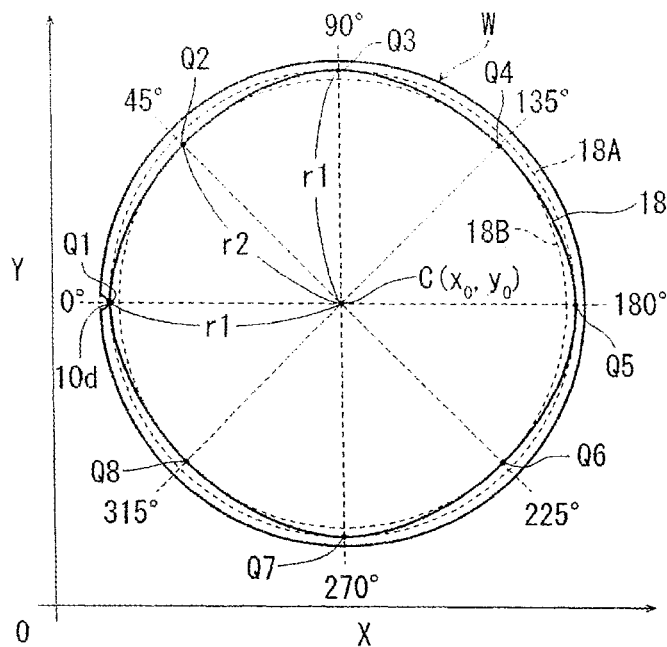
FIG. 6A is a conceptual diagram depicting the coordinates of an undersurface position set as a processing position by a coordinate generating step.

In order to apply the first to fourth branched laser beams LB1 to LB4 such that the end position of a crack formed by the first to fourth branched laser beams LB1 to LB4 is located at the outer circumference 17 over the entire periphery of the bonding layer 20 on the basis of the findings described above, the coordinates of the undersurface position set as the processing position 18 according to the present embodiment are set as follows in the coordinate generating step. Specifically, as depicted in FIG. 6A, the direction in which the notch 10d indicating the crystal orientation is formed as viewed from the center C of the first wafer 10 is defined as 0 degrees (point Q1). Coordinates at the 0 degrees (point Q1), 90 degrees (point Q3), 180 degrees (point Q5), and 270 degrees (point Q7) are arranged on a first concentric circle 18A having a radius of r1. Coordinates at 45 degrees (point Q2), 135 degrees (point Q4), 225 degrees (point Q6), and 315 degrees (point Q8) are arranged on a second concentric circle 18B having a radius of r2 smaller than the first concentric circle 18A. The coordinates of the undersurface position are generated as the processing position 18 to be irradiated with the first to fourth branched laser beams LB1 to LB4 by connecting coordinate points at the 0 degrees (point Q1), the 45 degrees (point Q2), the 90 degrees (point Q3), the 135 degrees (point Q4), the 180 degrees (point Q5), the 225 degrees (point Q6), the 270 degrees (point Q7), and the 315 degrees (point Q8) to one another by a smooth curve between the first concentric circle 18A and the second concentric circle 18B. The coordinates are stored in the coordinate storage unit 102 of the controller 100. Incidentally, it is inferred that, at adjacent points (points Q1 to Q8) on the processing position 18, the angle of cracks in the case of applying the first to fourth branched laser beams LB1 to LB4 gradually changes in a range of 54 degrees to 45 degrees. The following description will therefore be made supposing that the angle of cracks in the case of applying the first to fourth branched laser beams LB1 to LB4 along the processing position 18 gradually changes between the angle of the crack 11A and the angle of the crack 11B.

Figure 6B:
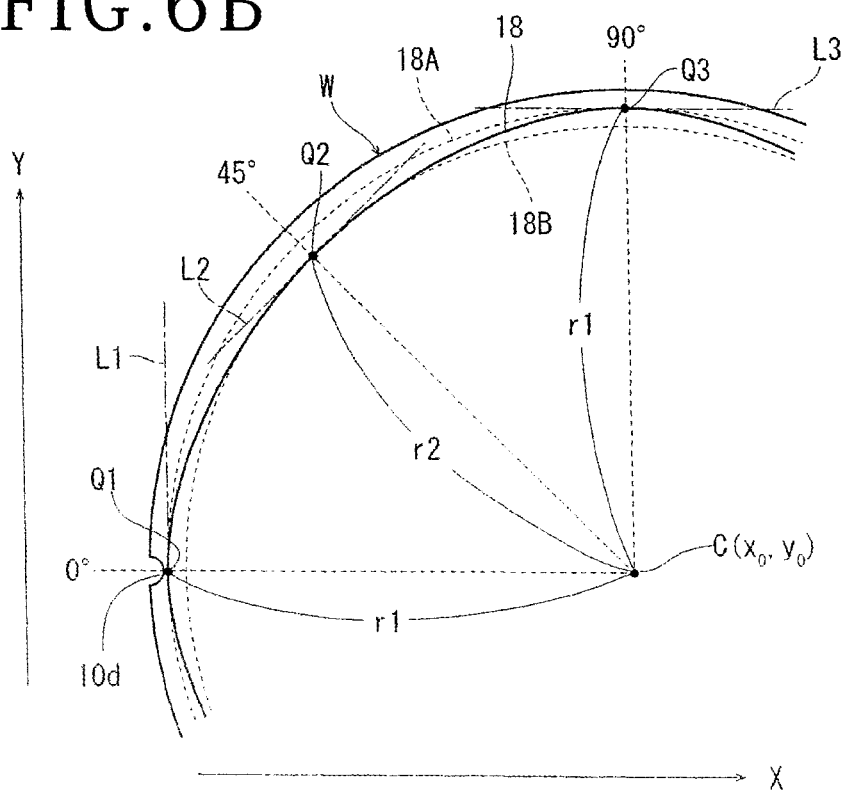
FIG. 6B is a conceptual diagram depicting a manner of generating the coordinates of the undersurface position by the coordinate generating step.

When the smooth curve of the undersurface position as the processing position 18 described above is generated, the smooth curve can be generated by a method as described in the following, for example. As depicted in FIG. 6B, a tangent L1 at the point Q1 on the first concentric circle 18A having the radius of r1 is generated. Next, a tangent L2 at the point Q2 on the second concentric circle 18B having the radius of r2 is generated. Then, the coordinates of the processing position 18 are generated such that, when the processing position 18 between the point Q1 and the point Q2 is generated, the radius r1 of the processing position 18 is made to gradually approach the radius r2 from the point Q1 to the point Q2 and the slope of the tangent on the processing position 18 is made to gradually approach the slope of the tangent L2 at the point Q2 from the slope of the tangent L1 at the point Q1, so that the tangent on the processing position 18 coincides with the tangent L2 at the point Q2 on the second concentric circle 18B at the point Q2.

In addition, when the coordinates of the processing position 18 from the point Q2 to the point Q3 are generated, the coordinates of the processing position 18 are generated such that the radius r2 of the processing position 18 is made to gradually approach the radius r1 from the point Q2 to the point Q3 and the coordinates of the processing position 18 are generated such that the slope of the tangent on the processing position 18 is made to gradually approach a tangent L3 at the point Q3 on the first concentric circle 18A, so that the angle of the tangent coincides with the tangent L3 at the point Q3. Thereafter, the coordinates of the undersurface position as the processing position 18 are similarly generated by connecting the coordinate points of the respective points Q1 to Q8 by a smooth curve between the point Q3, the point Q4, the point Q5, the point Q6, the point Q7, the point Q8, and the point Q1, that is, over the entire periphery of the bonded wafer W. When the coordinate generating step has thus been performed, the coordinates of the undersurface position as the processing position 18 are stored in the coordinate storage unit 102 of the controller 100. Incidentally, the outer circumference 17 of the bonding layer 20 is formed substantially 0.5 mm inward of an outer circumferential end of the bonded wafer W, and therefore, the coordinates of the processing position 18 are also set on a circumference about 149.5 mm from the center C of the bonded wafer W.

After the coordinate generating step described above generates the coordinates of the undersurface position as the processing position 18, a modified layer forming step to be described in the following is performed on the basis of the coordinates of the undersurface position which coordinates are stored in the coordinate storage unit 102 described above. More specifically, the controller 100 actuates the X-axis feed mechanism 4a and the Y-axis feed mechanism 4b to position the point Q1 of the processing position 18 of the bonded wafer W directly below the condenser 71 of the laser beam irradiating unit 7, as depicted in FIG. 4A. Next, the laser beam irradiating unit 7 described above is actuated to apply the first to fourth branched laser beams LB1 to LB4 along the processing position 18 identified by the coordinates of the undersurface position which coordinates are stored in the coordinate storage unit 102 of the controller 100. As depicted in FIG. 4B, the condensing points P1 to P4 of the first to fourth branched laser beams LB1 to LB4 applied at the point Q1 are plurally formed in a form of a descending staircase so as to approach the bonding layer 20 gradually from the inside to the outside of the first wafer 10. The modified layers S1 to S4 as depicted in FIG. 4C are formed by the condensing points P1 to P4, and the crack 11A having an angle of inclination of 54 degrees with respect to a horizontal plane is generated. The end position of the crack 11A reaches the coordinate position of the outer circumference 17 of the bonding layer 20.

Then, the chuck table 35 is rotated in the direction indicated by the arrow R2 in FIG. 4A or FIG. 5A, and the X-axis feed mechanism 4a and the Y-axis feed mechanism 4b are actuated to adjust the undersurface position irradiated with the first to fourth branched laser beams LB1 to LB4 such that the undersurface position coincides with the processing position 18 described above. As depicted in FIG. 5B, the condensing points P1 to P4 are positioned and applied to an inner part along the processing position 18 described above. Consequently, at the point Q2, the modified layers S1 to S4 as depicted in FIG. 5C are formed, and the crack 11B having an angle of inclination of 45 degrees with respect to the horizontal plane is generated. The end position of the crack 11B extending to the bonding layer 20 side reaches the coordinate position of the outer circumference 17 of the bonding layer 20. As described above, processing positions 18 between the point Q1 and the point Q2 are connected to each other by a smooth curve, and also between the point Q1 and the point Q2, the end position of the crack extending from the modified layer S1 to S4 reaches the coordinate position of the outer circumference 17 of the bonding layer 20.

Following the application of the first to fourth branched laser beams LB1 to LB4 from the point Q1 to the point Q2 along the processing position 18 identified by the coordinates of the undersurface position which coordinates are stored in the coordinate storage unit 102, as described above, the first to fourth branched laser beams LB1 to LB4 are applied to the points Q2 to Q8 and to the point Q1 on the processing position 18 described above. As described with reference to FIG. 6A and FIG. 6B, the coordinates of the undersurface position as the processing position 18 are set on the basis of the fact that lines connecting the undersurface position irradiated with the first to fourth branched laser beams LB1 to LB4, the internal positions of the condensing points P1 to P4, and the end positions of the cracks 11A to 11B extending from the condensing points P1 to P4 to the bonding layer 20 side are at different angles according to the crystal orientation of the first wafer 10, and a radius connecting the center C and the processing position 18 to each other changes between r1 and r2 according to a rotational angle. As a result, the end positions of the cracks 11A to 11B extending to the bonding layer 20 side reach the coordinate position of the outer circumference 17 of the bonding layer 20 over the entire circumference of the first wafer 10. Incidentally, in the present embodiment, the chuck table 35 is rotated two turns to perform the laser processing, so that a same position along the processing position 18 is irradiated with the first to fourth branched laser beams LB1 to LB4 described above twice. By performing the modified layer forming step as described above, it is possible to apply the first to fourth branched laser beams LB1 to LB4 to the inside of the chamfered portion 10C formed by a curved surface, thus avoid diffused reflection, and consequently generate the modified layers S1 to S4 and the cracks 11A to 11B with high accuracy. Incidentally, the intervals of the condensing points P1 to P4 formed by the first to fourth branched laser beams LB1 to LB4 described above are, for example, set in a range of 10 μm or less as viewed in the horizontal direction and a range of 1 to 10 μm as viewed in the vertical direction.

Laser processing conditions at a time of performing the laser processing of the modified layer forming step described above are, for example, set as follows.

Wavelength: 1342 nm
  Repetition frequency: 60 kHz
  Power: 2.4 W
  Number of branches: 4
  Chuck table rotational speed: 107.3 deg/s (circumferential speed of 280 mm/s)

Figure 7A:
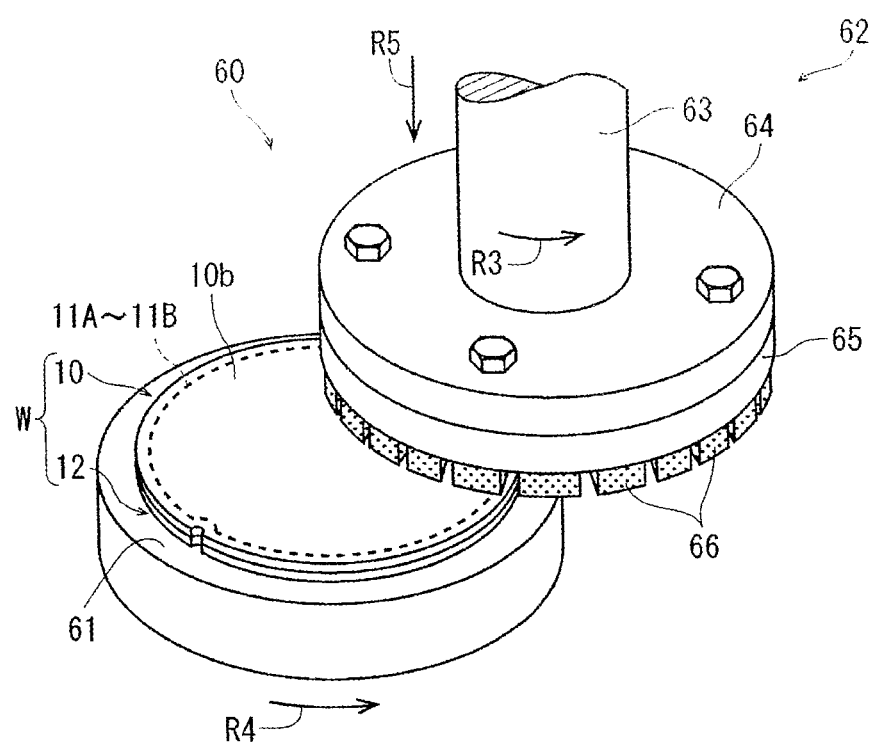
FIG. 7A is a perspective view depicting a manner of performing a grinding step.

After the modified layer forming step is performed as described above, the bonded wafer W is transported to a grinding apparatus 60 depicted in FIG. 7A (only a part of the grinding apparatus 60 is depicted). As depicted in the figure, the grinding apparatus 60 includes a grinding unit 62 for grinding and thinning the bonded wafer W sucked and held on a chuck table 61. The grinding unit 62 includes a rotary spindle 63 that is rotated by a rotational driving mechanism not depicted in the figure, a wheel mount 64 fitted to a lower end of the rotary spindle 63, and a grinding wheel 65 attached to a lower surface of the wheel mount 64. A plurality of grinding stones 66 are annularly arranged on a lower surface of the grinding wheel 65.

Figure 7B:
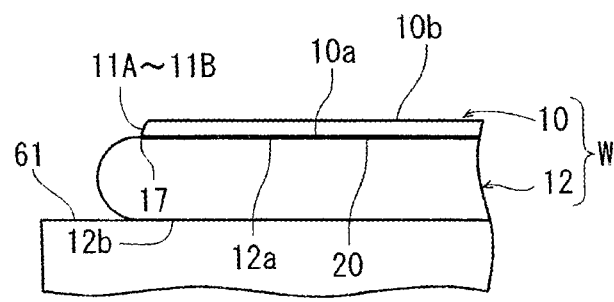
FIG. 7B is a side view depicting, on an enlarged scale, a part of the bonded wafer thinned by the grinding step.

After the bonded wafer W that has been subjected to the modified layer forming step described above is transported to the grinding apparatus 60 and the second wafer 12 side is mounted on the chuck table 61 and is sucked and held on the chuck table 61, the chuck table 61 is rotated at 300 rpm, for example, in a direction indicated by an arrow R4 while the rotary spindle 63 of the grinding unit 62 is rotated at 6000 rpm, for example, in a direction indicated by an arrow R3 in FIG. 7A. Then, while a grinding water supply mechanism not depicted in the figure supplies grinding water onto the undersurface 10b of the first wafer 10 of the bonded wafer W, the grinding stones 66 are brought into contact with the undersurface 10b of the first wafer 10, and the grinding wheel 65 is grinding-fed at a grinding feed speed of 1 μm/sec, for example, in a direction indicated by an arrow R5. At this time, it is possible to proceed with the grinding while measuring the thickness of the bonded wafer W by a contact type or noncontact type measuring gage not depicted in the figure. As depicted in FIG. 7B, the modified layers S1 to S4 described above are removed by grinding the undersurface 10b of the first wafer 10 by a predetermined amount, and the chamfered portion 10C including the notch 10d of the first wafer 10 is scattered and removed by a crack 11. Further, in the present embodiment, after the chamfered portion 10C is removed as described above, and the grinding step of grinding the bonded wafer W is completed, the grinding unit 62 is stopped, and a cleaning step, a drying step, and the like, whose description will be omitted, are performed. The bonded wafer processing method according to the present embodiment is thereby completed.

The bonded wafer processing method according to the present embodiment performs the coordinate generating step and the modified layer forming step as described above. Consequently, the plurality of condensing points P1 to P4 are set in a form of a descending staircase, the modified layers S1 to S4 are formed so as to spread out toward an end in the first wafer 10 constituting the bonded wafer W, the cracks 11A to 11B are developed so as to establish connection between the modified layers S1 to S4, and the cracks 11A to 11B extend to the coordinates of the outer circumference 17 of the bonding layer 20 described above while changing the angle at which the cracks extend according to a rotational angle position. When such a bonded wafer W is subjected to the grinding step described above, a breaking force is applied to the bonded wafer W, and the chamfered portion 10C is removed by the crack 11. Thus, in addition to the shortening of a processing time and a resulting improvement in productivity as compared with the conventional chamfered portion removal, the problem of damaging the other wafer (second wafer 12) is also solved. Further, because the coordinate generating step described above is performed, the cracks 11A to 11B extending from the modified layers S1 are stably developed to the coordinate position of the outer circumference 17 of the bonding layer 20, and thus the chamfered portion 10C can be removed reliably without an effect of the bonding layer 20 being incurred, even when the angle of the cracks 11A to 11B differs according to the rotational angle.

It is to be noted that, while the condensing point forming unit 74 constituting the laser beam irradiating unit 7 is implemented by using the half-wave plates, the beam splitters, the beam expanders, and the reflecting mirrors, or the like in multiple combination in the foregoing embodiment, the present invention is not limited to this. For example, a spatial light modulator (LCOS: Liquid Crystal On Silicon)

may be provided in place of the condensing point forming unit 74 depicted in FIG. 2. The laser beam LB emitted from the laser oscillator 72 may be made incident on the spatial light modulator 72 to branch the laser beam LB into the first to fourth branched laser beams LB1 to LB4, each of the branched laser beams may be applied according to the coordinates of the undersurface position as the processing position 18 which coordinates are generated in the coordinate generating step described above, the condensing points P1 to P4 may be formed in plural in a form of a descending staircase so as to gradually approach the bonding layer 20 from the inside to the outside of the bonded wafer, and thereby the modified layers S1 to S4 may be formed at desired positions.

In addition, in the foregoing embodiment, the bonded wafer W is transported to the grinding apparatus 60 in a state in which the chamfered portion 10C of the first wafer 10 remains, then the grinding step is performed, and the chamfered portion 10C is removed by the breaking force at a time of grinding with the crack 11 as a starting point, the crack 11 being formed in the modified layers S1 to S4. However, the present invention is not limited to this. Before the bonded wafer W is loaded into the grinding apparatus 60, and then the grinding step is performed, the chamfered portion 10C may be removed by the crack 11 formed in the modified layers S1 to S4 by applying an external force to the periphery of the first wafer 10.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method for processing a bonded wafer formed by bonding a top surface of a first wafer and a top surface or an undersurface of a second wafer having a same diameter as that of the first wafer to each other by a bonding layer, the first wafer having, on the top surface, a device region in which a plurality of devices are formed and a peripheral surplus region surrounding the device region, the peripheral surplus region having a chamfered portion at an outer edge thereof, the method comprising:
    a condensing point setting step of branching a laser beam of a wavelength transmissible through the first wafer into a plurality of laser beams, and setting condensing points of the respective branched laser beams at different positions;
    a coordinate generating step of generating coordinates of an undersurface position of the first wafer, the undersurface position being irradiated with the laser beams, such that an end position of a crack extending from the condensing points to the bonding layer side is located at an outer circumference of the bonding layer on a basis of a fact that a line connecting the undersurface position of the first wafer, the undersurface position being irradiated with the laser beams, internal positions of the condensing points in the first wafer, and the end position of the crack is at a different angle according to a crystal orientation of the first wafer;
    a modified layer forming step of forming a plurality of modified layers in a ring shape within the first wafer by positioning the condensing points of the branched laser beams in an inner part of the first wafer, the inner part being radially inward of the chamfered portion, and irradiating the coordinates of the undersurface position of the first wafer, the coordinates being generated in the coordinate generating step, with the laser beams of the wavelength transmissible through the first wafer, while holding the second wafer side by a first chuck table and rotating the first chuck table; and
    a grinding step of holding the second wafer side by a second chuck table and thinning the first wafer by grinding an undersurface of the first wafer after performing the modified layer forming step;
    in the modified layer forming step, the condensing points of the laser beams being formed in plural in a form of a descending staircase gradually approaching the bonding layer from an inside to an outside of the first wafer, the crack extending from a modified layer formed by a lowermost condensing point reaching the outer circumference of the bonding layer, and a plane connecting the plurality of modified layers formed by the plurality of condensing points forming a side surface of a circular truncated cone.

2. The bonded wafer processing method according to claim 1, wherein
    in the grinding step, the modified layers are removed by grinding the undersurface of the first wafer, and the chamfered portion is removed from the first wafer by the crack.

3. The bonded wafer processing method according to claim 1, wherein
    the first wafer is a single crystal silicon wafer, and
    in the coordinate generating step, a direction in which a notch indicating the crystal orientation is formed as viewed from a center of the first wafer is defined as 0 degrees, coordinates at the 0 degrees, 90 degrees, 180 degrees, and 270 degrees are arranged on a first concentric circle, coordinates at 45 degrees, 135 degrees, 225 degrees, and 315 degrees are positioned on a second concentric circle smaller than the first concentric circle, and the coordinates of the undersurface position of the first wafer, the undersurface position being to be irradiated with the laser beams, are generated by connecting coordinate points at the 0 degrees, the 45 degrees, the 90 degrees, the 135 degrees, the 180 degrees, the 225 degrees, the 270 degrees, and the 315 degrees by a smooth curve between the first concentric circle and the second concentric circle.

* * * * *